(12) United States Patent
Baklanov et al.

(10) Patent No.: US 9,595,422 B2
(45) Date of Patent: *Mar. 14, 2017

(54) PLASMA ETCHING OF POROUS SUBSTRATES

(71) Applicants: IMEC VZW, Leuven (BE); Katholieke Universiteit Leuven, Leuven (BE)

(72) Inventors: Mikhaïl Baklanov, Herent (BE); Liping Zhang, Leuven (BE); Jean-Francois de Marneffe, Bossut-Gottechain (BE)

(73) Assignees: IMEC VZW, Leuven (BE); Katholieke Universiteit Leuven, Leuven (BE)

( * ) Notice: Subject to any disclaimer, the term of this patent is extended or adjusted under 35 U.S.C. 154(b) by 0 days.

This patent is subject to a terminal disclaimer.

(21) Appl. No.: 15/072,141

(22) Filed: Mar. 16, 2016

(65) Prior Publication Data

US 2016/0276133 A1    Sep. 22, 2016

(30) Foreign Application Priority Data

Mar. 17, 2015 (EP) .................................... 15159463

(51) Int. Cl.
*B31D 3/00* (2006.01)
*H01J 37/32* (2006.01)
*H01L 21/3105* (2006.01)
*H01L 21/311* (2006.01)
*H01L 21/768* (2006.01)

(52) U.S. Cl.
CPC .... *H01J 37/32009* (2013.01); *H01L 21/3105* (2013.01); *H01L 21/31116* (2013.01); *H01L 21/76814* (2013.01); *H01L 21/76826* (2013.01); *H01J 2237/334* (2013.01)

(58) Field of Classification Search
CPC ................................................. H01J 37/32009
USPC ............................................................ 216/56
See application file for complete search history.

(56) References Cited

U.S. PATENT DOCUMENTS 8,961,803 B1    2/2015 Baklanov

FOREIGN PATENT DOCUMENTS

EP    2695182    5/2013

OTHER PUBLICATIONS

European Search Report issued in European Application No. 15159643 on Aug. 27, 2015.

*Primary Examiner* — Roberts Culbert
(74) *Attorney, Agent, or Firm* — Knobbe, Martens, Olson & Bear LLP

(57) ABSTRACT

The disclosed technology generally relates to semiconductor fabrication, and more particularly to plasma etching of dielectric materials having pores. In one aspect, a method for etching a porous material in an environment includes contacting the porous material with an organic gas at a pressure and a temperature. The organic gas is such that at the pressure and the temperature, the organic gas remains in a gas state when outside of the porous material, while the organic gas condenses into an organic liquid upon contacting the porous material. Upon contacting the porous material, the organic gas thereby fills the pores of the porous material with the organic liquid. Subsequent to contacting the porous material, the method additionally includes plasma etch-treating of the porous material having filled pores, thereby evaporating a fraction of the organic liquid filling the pores of the porous material.

15 Claims, 4 Drawing Sheets

PLASMA ETCHING OF POROUS SUBSTRATES

CROSS-REFERENCE TO RELATED APPLICATIONS

This application claims foreign priority to European Patent Application No. EP 15159463.7, filed Mar. 17, 2015, the content of which is incorporated by reference herein in its entirety.

BACKGROUND

Field

The disclosed technology generally relates to semiconductor fabrication, and more particularly to plasma etching.

Description of the Related Technology

When a porous substrate needs to be treated by etching, damage of the substrate often occurs. This is particularly true with plasma mediated treatments. This is presumably caused by active plasma radicals penetrating deeply into the porous substrate and reacting therewith, thereby changing its composition and its porosity. Both oxidative and reductive plasmas have such detrimental effects. These problems for instance occur in the field of microelectronics during integration of low-k dielectrics.

Low-k dielectrics, understood in semiconductor processing as referring to dielectric materials having a dielectric constant lower than the dielectric constant of $SiO_2$, i.e. lower than 4.0, are often used to decrease capacitance between nearby conductive portions of high density integrated circuits and thereby avoiding loss of speed (e.g., due to RC delay) and cross-talk (e.g., through capacitive coupling of adjacent conductive lines). In order to decrease the dielectric constant of low-k dielectrics as much as possible, low-k dielectrics are made porous. Thereby, the dielectric constant can be lowered down to about 2.0 or even less. Integrated circuit fabrication processes on dielectrics involve plasma etching and expose therefore the dielectrics to the damage mentioned above.

EP2595182 discloses, among other things, a method for treating a surface of a porous material in an environment, the method comprising the steps of:
  I. Setting the temperature of the surface to a value T2 and setting the pressure of the environment to a value P1,
  II. Contacting the surface with a fluid having a solidifying temperature at the pressure value P1 above the value T2 and having a vaporizing temperature at the pressure value P1 below 80° C., thereby solidifying the fluid in pores of the material, thereby sealing the pores,
  III. Treating the surface, wherein the treatment is preferably an etching or a modification of the surface,
  IV. Setting the temperature of the surface to a value T3 and setting the pressure of the environment to a value P2 in such a way as to vaporize the fluid.

Although this method can be effective at preventing some damage to porous substrates, an undesirable amount of damage can still occur.

There is therefore a need in the art for a way to further prevent damage to porous substrates upon treatment of the substrate (e.g., via etching or surface modification).

Problems to be Solved

More precisely, an aim set by the present disclosure, in at least one embodiment, is to provide a method which permits the plasma etching of a porous material surface while protecting it from excessive damage.

It is an advantage of at least some embodiments of the present disclosure that it may ease the cleaning of the porous material after the treatment.

It is an advantage of at least some embodiments of the present disclosure that a particularly good protection of the porous material can be obtained.

It is an advantage of at least some embodiments of the present disclosure that pores of very small dimensions (e.g. micropores) can be filled and protected.

It is an advantage of at least some embodiments of the present disclosure that plasma-induced fluorine diffusion within the porous material may be avoided or limited.

It is an advantage of at least some embodiments of the present disclosure that the method may protect the porous material against vacuum ultraviolet (VUV) induced damage, e.g., in implementations where the porous material is directly exposed to plasma.

It is an advantage of at least some embodiments of the present disclosure that it may allow plasma treatment at non-cryogenic temperature (e.g. at −50° C. or above), thereby reducing costs.

It is an advantage of at least some embodiments of the present disclosure that it may involve a moderate de-protecting temperature after the treatment, thereby reducing costs and increasing compatibility with temperature sensitive substrates.

It is an advantage of at least some embodiments of the present disclosure that it is an organic gas that is used for contacting a porous material, thereby permitting the contacting to occur in a vacuum chamber wherein the porous substrate is easily delivered and wherein plasma etch can be performed.

It is an advantage of at least some embodiments of the present disclosure that the plasma etching is performed under a pulsed plasma regime (i.e. the power of the plasma follows a cycle of on/off regimes). During the "off" regimes, pores are filled thereby avoiding a deterioration of the protection efficiency during the plasma etching of the porous material. The deterioration of the protection efficiency is linked to the elevation of the temperature of the porous material induced during the plasma etching, the elevation of temperature of the porous material leading to the evaporation of the filler used to fill the pores.

SUMMARY OF CERTAIN INVENTIVE ASPECTS

One inventive aspect directed to a method for etching a porous material 3 in an environment, the method comprising the successive steps of:
  I. Contacting a porous material with an organic gas in an environment having a pressure P1 and a temperature T1, wherein the organic gas is such that at the pressure P1 and at the temperature T1 it remains a gas when outside of the porous material but condenses as an organic liquid when in contact with the porous material, thereby filling pores of the porous material with the organic liquid,
  II. Plasma etch-treating the porous material having filled pores, thereby evaporating a fraction of the organic liquid filling the pores of the porous material, the successive steps being repeated n times, where n≥1.

This method permits a particularly efficient filling of the pores (e.g. including micropores), since the organic gas easily diffuses within the porous material (even in the micropores), then liquefies upon contact with the porous material and diffuses still to some extent by capillarity. This permits a filling of pores that compares favorably to a direct capillary filling by a liquid (which enters micropores with more difficulty) or to a filling with a gas that freeze upon contact with the porous material.

In a second aspect, the disclosed technology relates to a device comprising a treated porous material obtainable by a method according to any embodiment of the first aspect.

Particular aspects of the disclosed technology are set out in the accompanying independent and dependent claims. Features from the dependent claims may be combined with features of the independent claims and with features of other dependent claims as appropriate and not merely as explicitly set out in the claims.

The above and other characteristics, features and advantages of the disclosed technology will become apparent from the following detailed description, taken in conjunction with the accompanying drawings, which illustrate, by way of examples, the principles of various embodiments described herein. This description is given for the sake of example only, without limiting the scope of the disclosed technology. The reference figures quoted below refer to the attached drawings.

Figure 1:
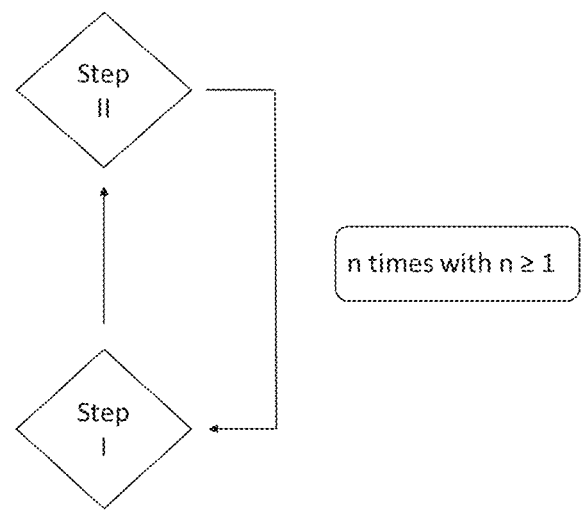
FIG. 1 is a flow chart illustrating an embodiment of the method according to the disclosure.

In the different figures, the same reference signs refer to the same or analogous elements.

DETAILED DESCRIPTION OF CERTAIN ILLUSTRATIVE EMBODIMENTS

The disclosed technology generally relates to semiconductor fabrication, and more particularly to plasma etching of porous materials, e.g., dielectrics, and even more particularly to protecting low-k dielectrics against plasma induced damage during plasma etching.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a method comprising steps A and B" should not be limited to methods consisting only of steps A and B. It means that with respect to the present disclosure, the only relevant steps of the method are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the disclosure, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

In the present description, reference will be made to organic compounds.

In the context of the present disclosure, an organic compound refers to a compound which contains carbon atoms, or a compound which contains carbon, oxygen and hydrogen. This includes organometallic compounds. Some embodiments however exclude organometallic compounds. In the present disclosure, organic compounds are the compounds that are contacted in their gas phase with the porous material, wherein they will transition to their liquid phase. In function of the specific context, the term organic compound will therefore sometimes be substituted by a more precise term where the phase of the compound is made explicit (organic gas or organic liquid). Each of these more specific terms however always refer to a same organic compound and can be substituted by the terms "organic compound in the gas phase" or "organic compound in the liquid phase".

In a first aspect, the disclosed technology disclosure relates to a method for etching a porous material in an environment, the method comprising the successive steps of:

I. Contacting a porous material with an organic gas in an environment having a pressure P1 and a temperature T1, wherein the organic gas is such that at the pressure P1 and at the temperature T1 it remains a gas when outside of the porous material but condenses as an organic liquid when in contact with the porous material, thereby filling pores of the porous material with the organic liquid, II. Plasma etch-treating the porous material having pores filled with the organic liquid, thereby evaporating a fraction of the organic liquid filling the pores of the porous material, the successive steps being repeated n times with n with n≥1.

The term "environment" refers to any kind of environment but is typically a chamber (e.g. comprising a bearing for the porous material). Preferably it is a chamber which temperature can be set below room temperature. Preferably it is a chamber which pressure can be set below 1 atm. A cryogenic chamber for plasma etching treatment is a typical example. Instead of cooling the whole chamber to temperature T1, preferably T2, a bearing within this chamber can be cooled down to the temperature T1, preferably T2. The plasma etching treatment is performed in a reactor selected from the group consisting of inductively-coupled plasma (ICP) reactor or capacitively-coupled plasma (CCP) reactor.

As used herein, the term "successive" can mean that the step I is performed before the step II, the term "successive" doesn't exclude that at least an additional step can be inserted between the steps I and II.

As used herein, the expression "evaporating a fraction of the organic liquid filling the pores of the porous material" can mean that the evaporation of a fraction of the organic liquid can occur in a fraction of the pores of the porous material and not necessarily in all the pores of the porous material.

The etching of the porous material can be any kind of etching. For instance it can be an isotropic etching, an anisotropic etching or a combination of both. It can be a chemical etching, a physical etching or a combination of both.

In a particular embodiment, the method according to the disclosure is such that each step II is performed until a fraction of x % in weight of the organic liquid filling the pores of the porous structure is evaporated, where x is in the range of 5% to 75%, 10 to 40%, or in the range of 10% to 30%. The amount of organic liquid filling the pores of the porous structure can be determined by the measure of the refractive index of the porous structure by ellipsometry.

In some embodiments, each step II is performed during a time period greater than or equal to 3 seconds. In some other embodiments, each step II is preferably performed during a time period lower than or equal to 120 seconds, lower than or equal to 60 seconds. In some other embodiments, each step II is performed during a time period in the range from 3 seconds to 120 seconds, or from 3 seconds to 60 seconds.

In some embodiments, the method according to the disclosure is such that each step I is performed during a time period greater than or equal to 1 second. In some other embodiments, each step I is performed during a time period lower than or equal to 10 seconds. In some other embodiments, each step I is performed during a time period comprised in the range of 1 second to 10 seconds.

In a particular embodiment, the method according to the disclosure is such that the environment comprises the organic gas which will be liquefied in the pores and an etching gas. This is advantageous because the gaseous mixture used in the step I and the step II may be the same avoiding a pumping of the gaseous mixtures from the environment between step I and step II.

In a particular embodiment, the method according to the disclosure comprises the successive steps of:

I. Contacting a porous material with an organic gas in an environment having a pressure P1 and a temperature T1, wherein the organic gas is such that at the pressure P1 and at the temperature T1 it remains a gas when outside of the porous material but condenses as an organic liquid when in contact with the porous material, thereby filling pores of the porous material with the organic liquid, II. Plasma etch-treating of the porous material having filled pores, thereby evaporating a fraction of the organic liquid filling the pores of the porous material, III. Stopping the plasma etching, thereby allowing the organic liquid to condense again in the pores of the porous material, thereby refilling the pores, IV. Repeating step II, and V. Optionally repeating step III and II n times with n with n≥1.

Typically, steps II to V are performed while the porous material remains in the presence of the organic gas and of the environment.

In a particular embodiment, the method according to the disclosure is such that the organic gas which is liquefied in the pores during the step I is the etching gas used in step II.

In a particular environment, the method according to the disclosure is such that the pressure P1 is lower than the equilibrium vapour pressure P0 of the organic gas at temperature T1 but equal to or higher than the critical pressure Pc at temperature T1, wherein the critical pressure Pc is the pressure at which the liquid phase and the vapour phase of the organic gas are at equilibrium within the porous material.

Without being bound by any theory, the critical pressure Pc may relate to the equilibrium vapor pressure $P_0$ of the organic gas via the following expression:

$$\ln\left(\frac{P_c}{P_0}\right) = -\frac{f \cdot \gamma \cdot V_L}{r_K \cdot RT}$$

Wherein f is a proportionality constant equal to cos θ, wherein θ is determined experimentally by measuring the contact angle of the organic liquid on the porous material, wherein γ is the surface tension of the organic liquid, wherein $V_L$ is the molecular volume of the organic liquid, wherein $r_K$ is the average radius of the pores, wherein R is the gas constant, and wherein T is the temperature of the porous material (typically $T_1$).

$P_1$ is typically lower than 1 atm.

The contact between the surface of the porous material and the organic gas is typically operated by introducing the gas directly as such in the environment where the porous material is. The contacting step between the surface of the porous material and the organic gas may lead to the gas liquefying at contact with the porous material and diffusing within the porous material down to a diffusion depth at least equal to the etch depth of the recess that will be etched in the material during the plasma etching step. This vertical diffusion is advantageous as it permits the porous material to have its pores filled down to the depth. The contacting of the surface of the porous material and the organic compound also usually leads to lateral diffusion under an optionally present mask (resist or hard mask). This vertical and/or lateral diffusion protects the pores of the recess walls during the entire etching process. This has a clear advantage over simply sealing the surface of the substrate with a coating not penetrating in the porous material. Indeed, the protection conferred by a simple not penetrating coating does not extend to the walls of the recesses being created.

In an embodiment the method according to the disclosure is such that the vaporization temperature of the organic liquid is preferably below 250° C., at pressure P1.

In an embodiment the method according to the disclosure is such that the organic gas is a gas of an organic compound selected from the group consisting of hydrocarbons, fluorocarbons, hydrofluorocarbons, alcohols, aldehydes, ketones, metal-organic complexes, organosilicon compounds and the mixture of at least two thereof. In various embodiments, the organic gas is a gas of an organic compound selected from the group consisting of hydrocarbons, fluorocarbons, hydrofluorocarbons, alcohols, aldehydes, ketones, metal organic complexes, organosilicon compounds and the mixture of at least two thereof.

In an embodiment, the organic compound may be selected from the group consisting of hydrocarbons, fluorocarbons, hydrofluorocarbons, alcohols, aldehydes, ketones, and mixtures thereof.

Suitable hydrocarbons may for instance be $C_{6-12}$ hydrocarbons. These hydrocarbons can be linear, branched or cyclic (e.g. cyclooctane, cyclodecane). These hydrocarbons may be saturated (e.g. nonane, decane) or not (e.g. 1-decene). They are advantageous because they confer some protection against vacuum UV (VUV) during plasma treatment. That is, such hydrocarbons can be substantially opaque to the UV radiation generated by the plasma and prevent the penetration of the UV radiation such that the porous material is protected from the UV radiation. For this purpose, longer hydrocarbons may be more suitable use with the disclosed technology under some circumstances.

Suitable fluorocarbons may for instance be $C_{4-10}$ fluorocarbons (e.g. $C_4F_8$, $C_8F_{18}$). These fluorocarbons can be linear, branched or cyclic. These fluorocarbons may be saturated or not.

Suitable hydrofluorocarbons may for instance be $C_{4-10}$ hydrofluorocarbons. These hydrofluorocarbons can be linear, branched or cyclic. These hydrofluorocarbons may be saturated or not.

Suitable organosilicon compounds are for instance siloxanes such as tetramethylcyclotetrasiloxane. Such compounds may help repairing the porous substrate in addition to protect it from damage.

In an embodiment, the organic compound may be selected from the group consisting of alcohols, aldehydes, ketones and the mixture of at least two thereof. Such organic compounds are advantageous for various reasons. First, in their liquid phase, they wet particularly well typical substrates used as low-k dielectrics (e.g. organosilicate glasses). These good wetting properties permit the organic liquid to fill efficiently (e.g. completely) the pores of the porous material. Second, such organic liquids help cleaning the treated porous material from waste products generated during the treatment.

According to an embodiment, the etching gas comprises a gaseous compound comprising at least a fluoride atom, preferably gaseous compound comprising at least a fluoride atom is selected from the group consisting of $NF_3$, $SF_6$, $XeF_2$, $XeF_6$, $CF_4$, $CHF_3$, $CH_2F_2$, $CH_3F$, $C_2F_6$, $C_4F_8$, $C_4F_6$, $C_5F_8$, $C_5F_7$, $C_6F_6$ and the mixture of at least two thereof, preferably selected from the group consisting of $SF_6$, $NF_3$, $XeF_2$, $XeF_6$, $CF_4$, $C_6F_6$ and the mixture of at least two thereof, more preferably selected from the group consisting of $SF_6$, $NF_3$, $XeF_2$, $XeF_6$, $CF_4$ and the mixture of at least two thereof, most preferably the etching gas is $SF_6$.

According to an embodiment, the method according to the disclosure is such that the gaseous flows of the organic gas and the etching gas are such that the ratio organic gas flow/etching gas flow is higher than or equal to 0.2, preferably the ratio organic gas flow/etching gas flow is lower than or equal to 0.8, more preferably the ratio organic gas flow/etching gas flow is comprised in the range of 0.2 to 0.8, the most preferably the ratio organic gas flow/etching gas flow is equal to 0.2, the gas flow being a sccm gas flow value.

According to an embodiment, the method according to the disclosure is such that the condensation temperature of the organic gas in the pores of the porous material is equal to or lower than −10° C., preferably equal to or lower than −20° C., more preferably equal to or lower than −50° C., at P1.

According to an embodiment, the method according to the disclosure is such that the temperature of the porous material is equal to T1 at the time of the performance of step I. In other embodiments, at the time of the performance of step I, it may be lower than T1 but higher than the melting temperature of the organic liquid.

The method according to the disclosure is such that the method does not comprise between the step I. and the step II., a step of cooling down the porous material to a temperature such that the organic liquid freezes within the pores.

In an embodiment, T1 may be lower or equal to 250° C., preferably from 10 to 40° C. Most preferably, T1 may be from 18 to 25° C.

In an embodiment, the method may further comprise before step I, the steps of:
Providing a porous material having a surface bearing a resist layer (IX), and
Patterning the resist layer so as to expose a surface of the porous material (X), thereby providing to the surface of the porous material the etching treatment of at least step I and II, thereby forming a recess in the porous material.

The porous material may be any porous material. The material can for instance take the form of a layer supported on a substrate or can be self-supported.

The porous material may for instance be a nanoporous material, i.e. a material which pores have on average a diameter comprised between 0.2 and 1000 nm, or may be a material which pores have on average a diameter equal to or larger than 1 μm. Preferably, the porous material is a nanoporous material.

Nanoporous materials can be subdivided into 3 categories, the macroporous materials, the mesoporous materials and the microporous materials.

As referred to herein, in certain embodiments, a macroporous material has pores that are greater than or equal to 50 nm and smaller than 1000 nm in diameter.

As referred to herein, in certain embodiments, a mesoporous material has pores greater than or equal to 2 nm and smaller than 50 nm in diameter.

As referred to herein, in certain embodiments, a microporous material has pores greater than 0.2 nm and smaller than 2 nm in diameter. Other embodiments may have range points that deviate by up to 10%.

The present disclosure can be used with nanoporous materials belonging to any of these three categories. However, an important family of materials for which the method according to embodiments of the present disclosure is particularly useful is mesoporous materials and in particular mesoporous low-k materials, in particular those with a pore diameter comprised between 2 and 10 nm.

These materials have repeatedly been demonstrated to suffer from plasma induced damage, making their etching an ongoing challenge which embodiments of the present disclosure helps to meet.

The porous material is preferably a porous low-k material.

In embodiments of the first aspect, the material may have a dielectric constant lower than 3.9, preferably lower than 3.5, more preferably lower than 3.0 and most preferably lower than 2.4. The method according to embodiments of the present disclosure is advantageously applied to such low-k materials, in particular prior to plasma treatment (e.g. etching). The use of plasma etching on such low-k materials has been shown to cause damage and waste products and embodiments of the present disclosure help to prevent such damage and to clean such waste products.

In embodiments of the first aspect, the porosity of the porous material may be interconnected (at least partly interconnected, preferably fully interconnected). When the porous material is interconnected, the method of the present disclosure permits to very efficiently fill all pores of the surface as well as some pores within the bulk volume of the material with liquid.

A material having a fully interconnected porosity is advantageous because an organic compound as defined in any embodiment of the present disclosure can fill all pores of a 1 μm thick material film in 2 minutes or less by contacting its top surface (if the top surface is free, i.e. has no hard mask, resist or else thereon).

In various embodiments of the present disclosure, the porous material may have a porosity of 10% or more, 20% or more, 30% or more or 40% or more. In some embodiments of the present disclosure, the porous material may have a porosity of 80% or less. A porosity of 10% means that the pores amounts for 10% of the volume of the porous material. A greater porosity is advantageous as it increases the speed of diffusion of the organic compound in the porous material. It therefore shortens the contacting step of the method and increases its efficiency.

In various embodiments, of the present disclosure, the thickness of the porous material is 600 nm or less, 400 nm or less or 300 nm or less. In some implementations, the pores of a 200 nm layer may be substantially filled in only a few seconds.

In embodiments of the present disclosure, the material may be a porous silicon-containing material.

Porous silicon-containing materials include for instance porous silica materials (e.g. not containing carbon atoms or containing less than 1% wt. carbon atoms) and porous organosilicate materials (e.g. containing more than 1% wt carbon atoms). Examples of porous silica materials are silica aerogels, silica xerogels, silsesquioxanes such as hydrisosilsesquioxane (HSQ), silicalite-based films, dendrite-based porous glass and mesoporous silica amongst others.

Examples of porous organosilicates are porous carbon-doped silicon dioxides and silsesquioxanes such as alkylsilsesquioxane (e.g. methylsilsesquioxane (MSSQ)), amongst others. Preferably the porous silicon-containing material is a porous organosilicate glass.

In an embodiment of the present disclosure, the porous material (e.g. a low-k material) may be prepared as follow before to perform step I:
 a surface of the porous material is optionally provided with a patterned hard mask (e.g. comprising TaN, TiN, SiN, or amorphous carbon) covering the surface,
 if a hard patterned mask is present, the plasma etching of step II is performed through the openings present in the patterned hard mask. The result is a porous material having an exposed surface.

In embodiments of the present disclosure, the porous material may be placed in the environment on a bearing. In the field of semiconductor processing, the bearing is typically a chuck. During step I, the porous material may be placed in thermal contact with the bearing. During step I, the temperature of the bearing may be set at T1. Controlling the temperature of the bearing is more efficient for controlling the temperature of the porous material surface than controlling the temperature of the entire environment (e.g. a chamber).

In embodiments of the present disclosure, the temperature T1 can be set actively or passively. Setting the temperature T1 passively is simply using the temperature of the environment (typically room temperature), without increasing or decreasing it to a target temperature and without performing particular acts to maintain it. Typically, setting the temperature passively will be performed by choosing an environment having the wished temperature. Setting the temperature actively implies increasing or decreasing the temperature of the environment to a target value or value range and maintaining the temperature at this value or within this range.

Both types of setting can be used with the present disclosure.

According to various embodiments the vaporization temperature of the organic liquid is below 250° C., below 200° C., below 150° C., below 80° C., or below 40° C. at the pressure P1 at which the contacting step between the surface and the organic gas is operated. This is advantageous as it permits to vaporize the organic compound after the treatment and therefore restore the porosity of the material with a relatively low energetic budget.

In various embodiments of the first aspect, the organic liquid may have a vaporizing point below 250° C. at 1 atm., below 235° C. at 1 atm., below 220° C. at 1 atm. or below 205° C. at 1 atm.

In various embodiments, the organic compound may have a melting point at P1 lower than 25° C., lower than 15° C. or lower than 10° C.

Particularly well suited organic compounds have a melting point at P1 lower than 5° C., lower than 0° C. or lower than −5° C. The melting point of these fluids can be higher than −130° C., or higher than −100° C. at P1.

In embodiments of the first aspect, the organic compound may have a melting point higher or equal to −50° C. at P1. According to various embodiments, the liquid may have a melting point at 1 atm. lower than 25° C., lower than 15° C. or lower than 10° C.

Particularly well suited liquids according to various embodiments have a melting point at 1 atm. lower than 200° C., lower than 100° C. or lower than 50° C. The melting point of some of these fluids can be higher than −50° C. or higher than −30° C. at 1 atm.

In embodiments of the first aspect, the liquid may have a melting point higher or equal to −50° C. at 1 atm.

Cleaning of a porous surface is not always easy because waste products tend to remain entrapped in the pores. In an embodiment, after the treatment and the resulting generation of waste product at the surface and within the pores below the surface, the vaporization of such organic liquids (alcohols, aldehydes and ketones) may drive the waste products out of the pores toward the surface. Once at the surface, they are more easily removed, e.g. by cleaning with an auxiliary liquid. Alternatively, in another embodiment, instead of vaporizing the organic liquid, the porous surface can be directly contacted with an auxiliary liquid miscible with the organic compound used to fill the pores.

Independently of the cleaning method used, the applicant has noticed that alcohol, aldehyde and ketone organic compounds are particularly efficient in cleaning the pores at and directly below the surface. Their affinity for the substrate provides these organic compounds with a good affinity for the waste products generated during the treatment of the substrate surface. This permits the organic compounds to attach to the waste product and to transport the waste products toward the surface either during the vaporization step or the auxiliary liquid contacting step.

In embodiments, the organic compound may be selected from alcohol, aldehydes, ketones having either a single hydroxyl group or carbonyl group and having from 6 to 12 carbon atoms, or two functions selected from hydroxyl and carbonyl functions and having from 2 to 5 carbon atoms.

In embodiments, the alcohol may be selected from monohydric alcohols and diols.

Illustrative examples of suitable alcohols are $C_{6-11}$ linear saturated monohydric alcohols such as but not limited to 1-hexanol, 1-octanol or 1-decanol, $C_{7-11}$ branched saturated monohydric alcohols such as but not limited to 2,2-dimethyl-3-pentanol or 2-decanol, $C_{6-8}$ aromatic monohydric alcohols such as but not limited to benzyl alcohol, $C_{2-5}$ linear diols such as but not limited to ethylene glycol or 1, 4-butane diol, $C_{5-6}$ cyclic saturated monohydric alcohols such as but not limited to cyclopentanol or cyclohexanol, and linear or branched unsaturated monohydric alcohols such as but not limited to geraniol.

Illustrative examples of suitable aldehydes are $C_{7-11}$ linear saturated aldehydes such as but not limited to octanal or nonanal, $C_{9-11}$ branched saturated aldehydes, $C_{7-9}$ aromatic aldehydes such as but not limited to benzaldehyde and phenyl acetaldehyde.

Illustrative examples of suitable ketones may have the general formula $R_1COR_2$ wherein $R_1$ and $R_2$ either form a 6 or a 7 members cycle or are independently selected from phenyl and $C_{1-10}$ alkyl chains. Preferably the total number of carbons in the ketone is from 6 to 12.

Illustrative examples of suitable ketones are cyclohexanone, 4-heptanone, 2-decanone and phenyl propyl ketone.

Alcohols, aldehydes, and ketones having longer alkyl chains have the advantage to confer some protection against VUV.

In embodiments, the method further comprises the additional steps of filling at least partially the recess with a metal, the recess being obtained after the step II wherein the filling at least partially the recess with a metal is performed after the step II and before or after step of removing the organic solid, if the step of removing the organic solid is performed. This is advantageous since the sealed pores of the recess walls prevent penetration of the metal in the pores.

In embodiments, optionally no hard mask is used prior to form the recess.

The method according to the disclosure advantageously prevent plasma-induced damage due to the diffusion of the organic liquid in the pores, the protection of the pores toward the treatment extends to a certain depth below the surface of the porous material. This permits to create recesses via etching in the porous material while benefiting from the protective effect of the organic compound during the whole etching process.

In a second aspect, the present disclosure relates to a device comprising a treated porous material obtainable by the method according to any embodiment of the first aspect.

In embodiments, the device obtained by the method of the first aspect may comprise trenches in a surface thereof, the porous material having a k-value lower than 2.5, preferably lower than 2.3.

In an embodiment, the k-value exists at the level of the trenches.

The disclosed technology will now be described by a detailed description of several embodiments of the disclosure. It is clear that other embodiments of the disclosure can be configured according to the knowledge of persons skilled in the art without departing from the technical teaching of the disclosure, the disclosure being limited only by the terms of the appended claims.

Referring to FIG. 1:

FIG. 1 is a flow chart illustrating an embodiment of a process according to the disclosure. The process comprising a least the successive steps of:

Step I: contacting a porous material with an organic gas in an environment having a pressure P1 and a temperature T1, wherein the organic gas is such that at the pressure P1 and at the temperature T1 it remains a gas when outside of the porous material but condenses as an organic liquid when in contact with the porous material, thereby filling pores of the porous material with the organic liquid, Step II: plasma etching treatment of the porous material having pores filled with the organic liquid, thereby evaporating a fraction of the organic liquid filling the pores of the porous material, the successive steps being repeated n times with n with n≥1.

Figure 2:
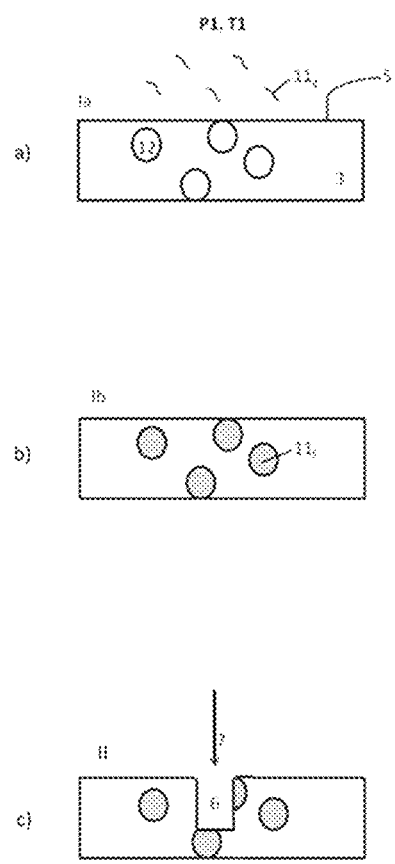
FIG. 2 is a diagrammatic illustration of a process according to another embodiment of the present disclosure.

Referring to FIG. 2:

FIG. 2 illustrates an embodiment where the pores 12 of a porous are filled and thereby sealed before etching 7 the surface 5 of the porous substrate 3:

In step (Ia), a porous low-k material 3 having a surface 5 is provided in an environment having a pressure P1 and a temperature T1. An organic gas 11g is provided in the environment. The organic gas 11g is such that at the pressure P1 and at the temperature T1 it remains a gas when outside of the porous material 3 but condenses as an organic liquid 11l when in contact with the porous material 3.

In step (Ib), the result of contacting the porous material 3 and the organic gas 11g is shown. As illustrated, the organic gas 11g has condensed within the pores 12 of the porous material 3 and filled the pores 12 with a liquid 11l.

In step (II), the protected porous material 3 is then etched with a fluorine containing plasma 7 down to the appropriate depth. The etching creates a trench 6.

The step I and step II being reproduced n times with n≥1

Figure 3:
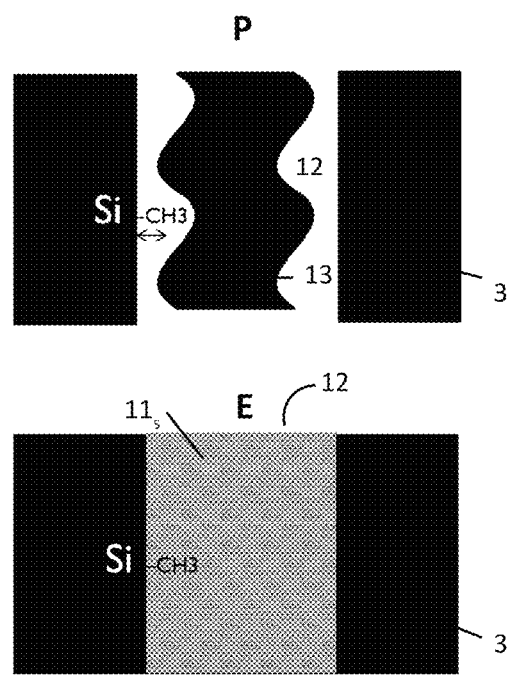
FIG. 3 is a schematic illustration of the device used.

Referring to FIG. 3:

FIG. 3 shows a cryogenic etch system equipped with in-situ Spectroscopic Ellipsometry. The plasma etch system (A601E from Alcatel) contains a transfer chamber with a normal chuck (bearing), and a main process chamber with cooling chuck. The cooling system uses liquid $N_2$ flow as cryogen, the chuck temperature can be varied from room temperature to −160° C. Meantime, the helium backside flow enables a good thermal contact between wafer and chuck. Plasma is generated by 13.56 MHz ICP source, and cryogenic chuck is negatively biased by second 13.56 MHz generator. A multi-wavelength spectroscopic ellipsometry (SE) with wavelength range from 350 nm to 800 nm is installed on process chamber, enabling fast inspection to the samples being processed on cryogenic chuck. In-situ measurement of refractive indices is performed by a multi-wavelength spectroscopic ellipsometer, enabling a fast measurement on 28 different wavelengths from 350 nm to 800 nm. A single layer Cauchy model is employed for fitting of Refractive Index (RI) and the film thickness.

The etching gas used are selected from the group consisting of $SF_6$ (used as main etchant providing high concentration of F radicals to enable high etch rate), $NF_3$, $XeF_2$, $XeF_6$, $CF_4$ and the mixture of at least two thereof and the organic gas used (providing protection through capillary condensation) are selected from the group consisting of $C_6F_6$, $C_4F_8$ and their mixtures.

The low-k material used was a porous organosilicate from SBA Materials Inc. The low-k films have initial thickness of 200 nm and pristine k value≈2.33. The porous structure was evaluated by ellipsometric porosimetry, showing open porosity of 38%, with pore radius of 1.4 nm. The low-k material was transferred to process chuck at low temperature. (i.e. −82° C. for $C_6F_{6\ (organic\ gas)}/SF_{6\ (etching\ gas)}$). The step I is performed under a gas flow of 50 sccm $SF_6$, 10 sccm $C_6F_6$, the pressure of the environment was regulated to 6 Pa, the condensation of the organic gas happens as soon as critical pressure is reached. The step II was performed under a transformer-coupled plasma (TCP) power 500 W, a reactive ion-etching (RIE) power 50-250 W, a gas flow of 50 sccm $SF_6$, 10 sccm $C_6F_6$, a pressure of 6 Pa, a temperature of −82° C. Etching time (step II) in one cycle was short enough to keep partial condensation for sufficient protection. In case of $C_6F_6/SF_6$, the etching time was less than 60 seconds. Then the plasma power off time was long enough to restore complete condensation (step I), the condensation time was around 10 seconds. The Steps I and II were repeated n times, where n≥0, until the expected etching is obtained. Finally, the etched porous material was moved to the transfer chamber, to be warmed up with pure $N_2$ to avoid moisture uptake.

Figure 4:
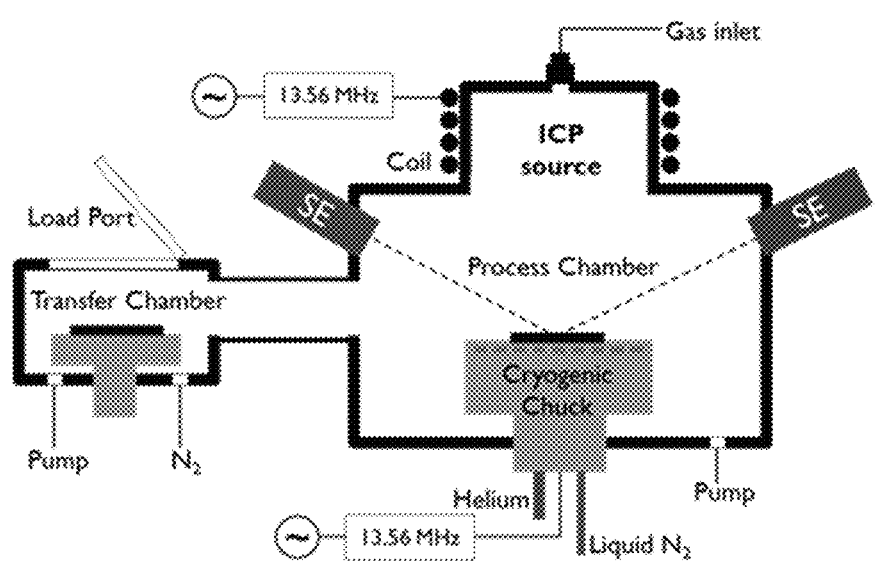
FIG. 4 shows the evolution of the refractive index of a porous material with the condensation of a pure gas ($C_6F_6$, $C_4F_8$ or $SF_6$).

Referring to FIG. 4:

FIG. 4 shows the evolution of the refractive index of a porous organosilicate from SBA Materials Inc. with the temperature of the environment under a pressure of 1 Pa of a porous organosilicate from SBA Materials Inc. The condensation of pure gas ($C_6F_6$, $C_4F_8$ or $SF_6$) on the porous organosilicate from SBA Materials Inc is illustrated by the increase of the measured of the refractive index. $C_6F_6$ condenses at much higher temperature than $C_4F_8$ and $SF_6$ is not condensed.

Figure 5:
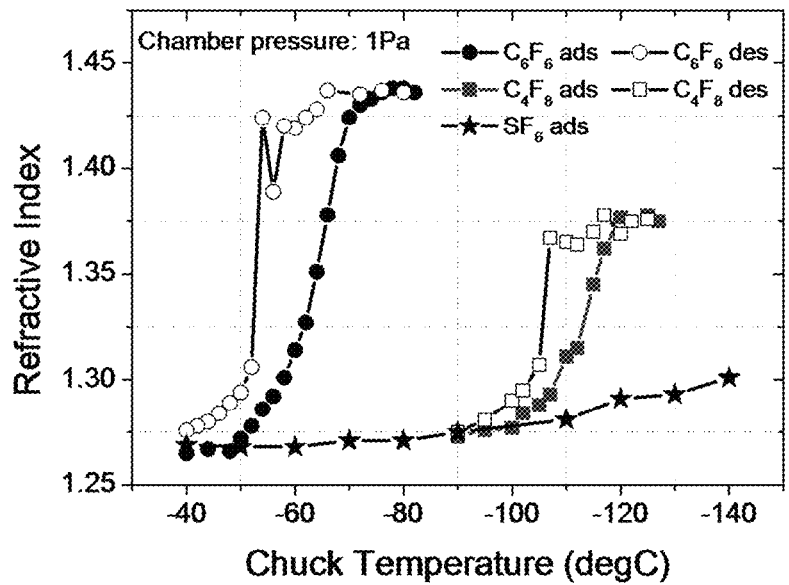
FIG. 5 shows the evolution of the refractive index of a porous material with the condensation (adsorption) and the evaporation (desorption) of a mixture of gas ($SF_6/C_6F_6$).

Referring to FIG. 5:

FIG. 5 shows the evolution of the refractive index of a porous organosilicate from SBA Materials Inc. with the condensation (adsorption) and the vaporization (desorption) of a mixture of gas ($SF_6/C_6F_6$) with the temperature of the environment under a pressure of 1 Pa.

Figure 6:
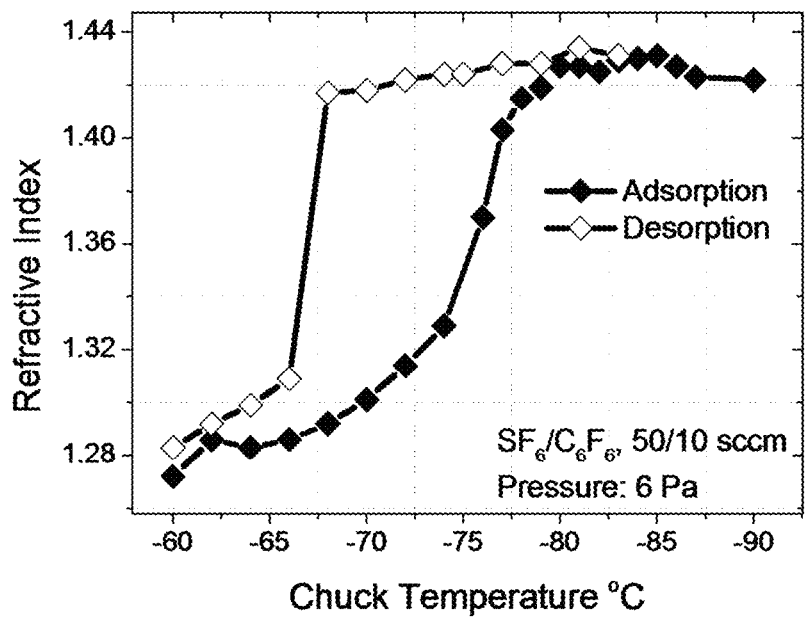
FIG. 6 shows the evolution of the refractive index during a plasma etching according to an embodiment of the disclosure.

Referring to FIG. 6:

FIG. 6 shows the evolution of the refractive index of a porous organosilicate from SBA Materials Inc. during a plasma etching in a $C_6F_6/SF_6$ atmosphere. The pores of the porous organosilicate have been previously filled with $C_6F_6$ liquid. The refractive index decreases during the plasma etch with $C_6F_6/SF_6$ due to the vaporization of the the $C_6F_6$, the vaporization being linked to the elevation of the temperature of the porous organosilicate during the plasma etching. The vaporization of the $C_6F_6$ will lead to an insufficient protection of the porous organosilicate. Therefor the plasma is switched off, $C_6F_6$ partial pressure increases again. Driven by capillary force, fully condensation will be restored within few seconds. By employing this cyclic process, a damage free etched porous organosilicate is thus obtained.

Figure 7:
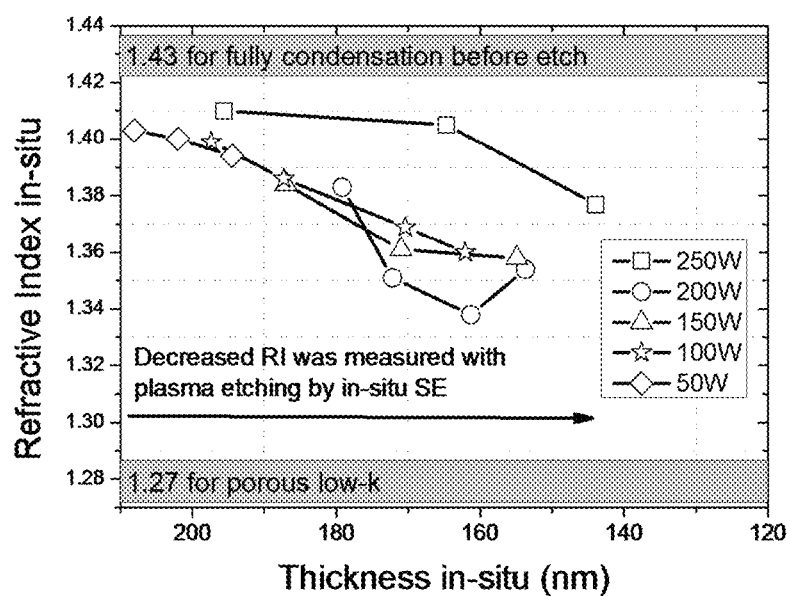
FIG. 7 is a graph showing the evolution of the in-situ refractive index as a function of the etching progression at different powers during the plasma etching of FIG. 6.

FIG. 7 shows the evolution for the refractive index as a function of the plasma etching progression (from 200 nm thickness to 140 nm thickness), measured in situ by spectroscopic ellipsometry for the same experiment as in FIG. 7. As can be seen, the refractive index decreased from about 1.43 at full condensation before etch to 1.27 for porous low-k. Similar observations have been made for different reactive ion etching powers ranging from 50 to 250 W.

It is to be understood that although preferred embodiments, specific constructions and configurations, as well as materials, have been discussed herein for devices according to the present disclosure, various changes or modifications in form and detail may be made without departing from the scope of this disclosure. For example, any formulas given above are merely representative of procedures that may be used. Functionality may be added or deleted from the block diagrams and operations may be interchanged among functional blocks. Steps may be added or deleted to methods described within the scope of the present disclosure.

What is claimed is:

1. A method of etching a porous material, comprising:
   contacting a porous material with an organic gas in an environment having a pressure (P1) and a temperature (T1), wherein the organic gas is such that at the pressure (P1) and the temperature (T1), the organic gas remains in a gas state when outside of the porous material, while the organic gas condenses into an organic liquid when in contact with the porous material, wherein when in contact with the porous material, the organic liquid fills pores of the porous material;
   subsequent to the contacting, plasma etch-treating the porous material having the pores filled with the organic liquid, thereby evaporating a fraction of the organic liquid filling the pores of the porous material; and
   repeating contacting and plasma etch-treating n times, wherein n≥1.

2. The method according to claim 1, wherein plasma etch-treating is performed for a duration greater than or equal to 3 seconds.

3. The method according to claim 1, wherein contacting the porous material is performed for a duration greater than or equal to 1 second.

4. The method according to claim 1, wherein the method is carried out in a gaseous environment comprising the organic gas and an etching gas.

5. The method according to claim 4, wherein the organic gas is the etching gas.

6. The method according to claim 1, wherein the pressure (P1) is lower than an equilibrium vapor pressure (P0) of the organic gas at the temperature (T1) while being equal to or higher than a critical pressure (Pc) at the temperature (T1), wherein the critical pressure (Pc) is the pressure at which the liquid phase and the vapor phase of the organic gas are at equilibrium within the porous material.

7. The method according to claim 1, wherein a vaporization temperature of the organic liquid is below 250° C. at the pressure (P1).

8. The method according to claim 1, wherein the organic gas is a gas of an organic compound selected from the group consisting of hydrocarbons, fluorocarbons, hydrofluorocarbons, alcohols, aldehydes, ketones, metal-organic complexes, organosilicon compounds and mixture of at least two thereof.

9. The method according to claim 1, wherein a condensation temperature of the organic gas in the pores is equal to or lower than −10° C. at the pressure (P1).

10. The method according to claim 1, wherein the porous material during contacting the porous material with the organic gas is at the temperature (T1).

11. The method according to claim 1, wherein the porous material is a nanoporous material.

12. The method according to claim 11, wherein the nanoporous material is a silicon-containing porous material.

13. The method according to claim 1, wherein the plasma etch-treating exposes the porous material directly to a vacuum ultraviolet (VUV) radiation generated by a direct plasma, and wherein the organic liquid comprises hydrocarbons that are substantially opaque to the VUV radiation.

14. The method according to claim 13, wherein the pores of the porous material are interconnected within the porous material such that after the contacting, the organic liquid diffuses into the porous material below a surface of the porous material to a diffusion depth.

15. The method according to claim 14, wherein plasma etch-treating further comprises etching the porous material to an etch depth equal to or less than the diffusion depth, such that the porous material that is exposed at the etch depth to the VUV radiation is protected from the VUV radiation by the organic liquid having the hydrocarbons.

\* \* \* \* \*